United States Patent [19]
Sanchez et al.

[11] Patent Number: 6,016,001
[45] Date of Patent: Jan. 18, 2000

[54] METAL TO AMORPHOUS SILICON TO METAL ANTI-FUSE STRUCTURE

[75] Inventors: Ivan Sanchez; Danny Echtle; Landon B. Vines, all of San Antonio, Tex.

[73] Assignee: VLSI Technology, Inc., San Jose, Calif.

[21] Appl. No.: 08/878,707

[22] Filed: Jun. 19, 1997

[51] Int. Cl.[7] ................................................. H01L 29/94
[52] U.S. Cl. ........................ 257/530; 257/50; 257/208; 257/530; 438/600
[58] Field of Search ............................. 257/50, 208, 528, 257/530; 438/600

[56] References Cited

U.S. PATENT DOCUMENTS

| | | | |
|---|---|---|---|
| 5,374,832 | 12/1994 | Tung et al. | 257/50 |
| 5,514,900 | 5/1996 | Iranmanesh | 257/530 |
| 5,576,576 | 11/1996 | Hawley et al. | 257/530 |

*Primary Examiner*—Valencia Martin-Wallace
*Attorney, Agent, or Firm*—Wagner Murabito & Hao LLP

[57] ABSTRACT

An anti-fuse structure and method for forming such structure. In one embodiment, the anti-fuse structure of the present invention includes a dielectric layer which is deposited over a metal layer. The semiconductor substrate is then masked and etched so as to form openings in the dielectric layer. Metal is deposited over the semiconductor substrate and is polished so as to remove the metal which overlies the dielectric layer so as to form a plug which extends through the dielectric layer and which electrically connects to the metal layer. An amorphous silicon block is then deposited, masked and etched so as to form an amorphous silicon block over the plug. A metal layer is then deposited, masked and etched so as to form an interconnect. The amorphous silicon block lies between the metal layer and the interconnect so as to prevent the flow of electrical current until such time as the anti-fuse is activated. The anti-fuse is activated by running a voltage higher than the threshold voltage of the anti-fuse between the interconnect and the plug. Upon activation of the anti-fuse, an electrical connection is made between the interconnect and the metal layer.

11 Claims, 9 Drawing Sheets

METAL TO AMORPHOUS SILICON TO METAL ANTI-FUSE STRUCTURE

TECHNICAL FIELD

The present claimed invention relates to the field of semiconductor devices. More specifically, the present claimed invention relates to an anti-fuse structure and methods for forming an anti-fuse structure.

BACKGROUND ART

Computer chip manufacturing processes typically include the formation of p-n junctions in a semiconductor substrate which are connected by polysilicon which is deposited, masked, and etched to form a patterned polysilicon surface. The patterned polysilicon surface connects with the p-n junctions so as to form numerous semiconductor devices on the semiconductor substrate. Typically, one or more layers of dielectric is then deposited over the surface of the semiconductor. The dielectric is then masked and etched to expose portions of the polysilicon surface through openings which are commonly referred to as vias. A layer of metal or "first metal" is then deposited over the surface of the semiconductor substrate. Typically aluminum is used since it is easy to deposit and form and since it has good conductivity. The metal overlies the layer of dielectric and fills the vias so as to form contacts or "plugs" that make contact between the metal layer and the polysilicon layer so as to allow for contact between the first metal layer and the semiconductor devices. The first metal layer is then masked and etched so as to form metal lines or "interconnects" which connect to the various semiconductor devices by the plugs. Alternate layers of dielectric and metal are then formed over the first metal layer to complete the semiconductor device.

Anti-fuses are structures which selectively allow for electrical contact between electrical circuits. Anti-fuses are typically formed within semiconductor devices to selectively allow for connection to electronic circuits located within the semiconductor device. This allows for easy programming of discrete functions and processes which may be selectively engaged by activating one or more anti-fuses. Anti-fuses in semiconductor devices are typically activated by running a voltage equal to or greater than the threshold voltage and a threshold amount of current to an anti-fuse structure. The voltage and current causes electron migration such that electrical contact is made within the fuse. Once a fuse is activated, the fuse stays open.

Anti-fuses are typically formed between metal layers in semiconductor devices. Thus, special process steps must be added to the semiconductor manufacturing process in order to form anti-fuses between metal layers.

Recent prior art anti-fuses and methods for forming anti-fuses are expensive due to the number of process steps involved. In prior art anti-fuse formation techniques, a dielectric layer which is typically an oxide, commonly referred to as an Inter Metal Oxide (IMO) is deposited over the semiconductor surface. Prior art FIG. 1A shows semiconductor substrate 101 after oxide layer 106 has been deposited over first metal layer 105. Typically, first metal layer 105 is connected to semiconductor devices formed within the semiconductor substrate which include gates such as gates 102–103 by metal plugs such as metal plug 104.

Metal layer 107 is then deposited over dielectric layer 106 as shown in prior art FIG. 1B. Metal layer 107 is then masked and etched to form a strap. Prior art FIG. 1C shows semiconductor device 120 after mask and etch steps have formed strap 108. A layer of amorphous silicon is then deposited. Prior art FIG. 1D shows the structure of prior art FIG. 1C after the deposition of layer of amorphous silicon 109 thereover.

A second mask and etch step is then performed to form an amorphous silicon block. Amorphous silicon block 110 overlies strap 108 as shown in prior art FIG. 1E. An oxide layer oxide layer is then deposited. With reference to prior art FIG. 1F, it can be seen that oxide layer 111 is deposited such that it overlies silicon block 110 and such that it overlies strap 108 and portions of dielectric layer 106.

A third mask and etch process is performed. Prior art FIG. 1G shows the structure of prior art FIG. 1F after masking and etching process steps have formed opening 112 and opening 113 within oxide layer 111. Opening 112 exposes portions of the top surface of amorphous silicon block 110 and opening 113 exposes portions of the top surface of strap 108.

A metal layer is then deposited over the semiconductor surface. FIG. 1H shows the structure of prior art FIG. 1G after deposition of metal layer 114. Metal layer 114 fills openings 112–113 and it overlies the top surface of oxide layer 111.

The metal layer is masked and etched. As shown in prior art FIG. 1I, the mask and etch steps remove some of metal layer 114 shown in prior art FIG. 1H so as to form interconnect 115 and interconnect 116. Interconnect 116 overlies strap 108 so as to electrically connect interconnect 116 to strap 108. Interconnect 115 overlies amorphous silicon block 110 such that amorphous silicon block 110 is disposed between strap 108 and interconnect 115.

Upon applying a sufficient amount of voltage and current between interconnect 115 and interconnect 116, electrons will migrate through amorphous silicon block 110. This migration process generates heat and causes some of the titanium tungsten metal to migrate from strap 108 so as to form an electrical connection between strap 108 and interconnect 115.

Anti-fuse fabrication processes are expensive and the manufacturing process is time consuming due to the number of complex steps of the fabrication process. Moreover, the deposition, mask and etch process increase the number of defects in the manufacturing process, thereby decreasing yield. The numerous deposition, mask and etch steps also take up a significant amount of time so as to cause low throughput rates.

Thus, a need exists for a anti-fuse structure and a method for forming an anti-fuse structure which is easy to manufacture. A further need exists for an anti-fuse structure and a method for forming an anti-fuse structure which minimizes fab process time and which allows for the less expensive manufacture of anti-fuse structures. Moreover, an anti-fuse structure and a method for forming an anti-fuse structure is needed that will increase yield and throughput of manufacturing. The present invention meets the above needs.

DISCLOSURE OF THE INVENTION

The present invention provides an anti-fuse structure which is simpler than prior art anti-fuse structures and which is easier and less expensive to manufacture than prior art anti-fuse structures. The fabrication of the anti-fuse structure of the present invention requires less process steps than prior art anti-fuse manufacturing processes, thereby increasing yield and throughput rates. The present invention achieves the above accomplishments with an anti-fuse structure and a method of forming an anti-fuse structure which locates the amorphous silicon block over a plug which connects to an underlying metal layer. This structure eliminates the need to form a strap and eliminates some of the process steps of prior art processes.

In one embodiment of the present invention, an anti-fuse structure is formed over a semiconductor substrate which includes semiconductor devices which connect to a first metal layer. A layer of dielectric overlies the first metal layer. The anti-fuse structure includes a plug that contacts the first metal layer and which extends through an opening in the dielectric layer. The plug is formed of a conductive material that has a low melting temperature such as a mixture of titanium and tungsten. An amorphous silicon block overlies the top of the plug. An interconnect of a second metal layer overlies the amorphous silicon block.

The anti-fuse structure of the present invention connects the first metal layer to the second metal layer. The fuse is engaged by applying current and voltage equal to or greater than the threshold voltage to the first metal layer. Upon the application of voltage and current meeting the threshold of the anti-fuse, electrons migrate through the amorphous silicon block, heating the amorphous silicon block and the titanium tungsten plug so as to cause migration of the titanium tungsten metal. This migration forms electrical contact between the first metal layer and the second metal layer.

The anti-fuse structure and the method of fabrication of an anti-fuse of the present invention takes full advantage of standard semiconductor fabrication steps. In the present invention, only two fabrication steps are required in addition to standard semiconductor process fabrication steps. These steps are the deposition and etch of an amorphous silicon layer in order to form an amorphous silicon block. Thus, the present invention eliminates the prior art process steps of depositing a metal layer and etching the metal layer to form a strap.

These and other objects and advantages of the present invention will no doubt become obvious to those of ordinary skill in the art after having read the following detailed description of the preferred embodiments which are illustrated in the various drawing figures.

BRIEF DESCRIPTION OF THE DRAWINGS

The accompanying drawings, which are incorporated in and form a part of this specifications illustrate embodiments of the invention and, together with the description, serve to explain the principles of the invention.

Prior Art

Prior Art

Prior Art

Prior Art

Prior Art

Prior Art

Prior Art

Prior Art

Prior Art

BEST MODE FOR CARRYING OUT THE INVENTION

Reference will now be made in detail to the preferred embodiments of the invention, examples of which are illustrated ill the accompanying drawings. While the invention will be described in conjunction with the preferred embodiments, it will be understood that they are not intended to limit the invention to these embodiments. On the contrary, the invention is intended to cover alternatives, modifications and equivalents, which may be included within the spirit and scope of the invention as defined by the appended claims. Furthermore, in the following detailed description of the present invention, numerous specific details are set forth in order to provide a thorough understanding of the present invention. However, it will be obvious to one of ordinary skill in the art that the present invention may be practiced without these specific details. In other instances, well known methods, procedures, components, and circuits have not been described in detail as not to unnecessarily obscure aspects of the present invention.

Figure 1A:
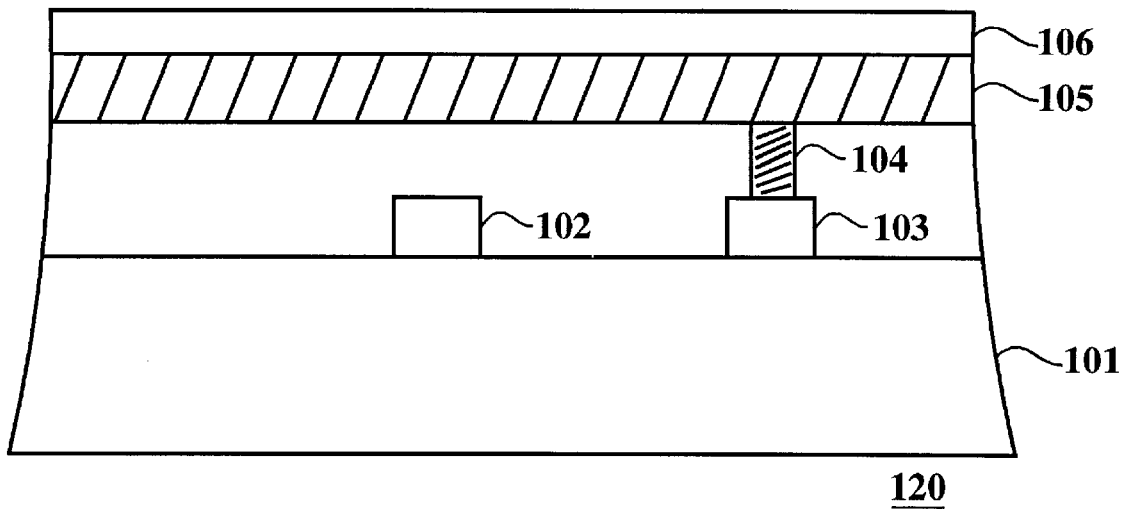
FIG. 1A is a cross-sectional view illustrating steps associated with a prior art process for forming an anti-fuse structure.
Figure 1B:
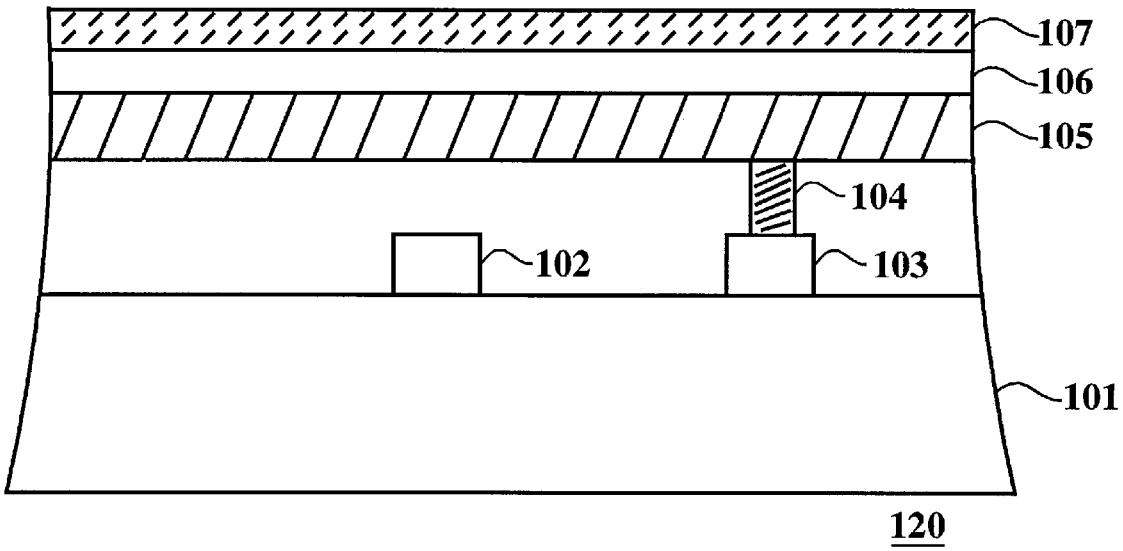
FIG. 1B is a cross-sectional view illustrating steps associated with a prior art process for forming an anti-fuse structure.
Figure 1C:
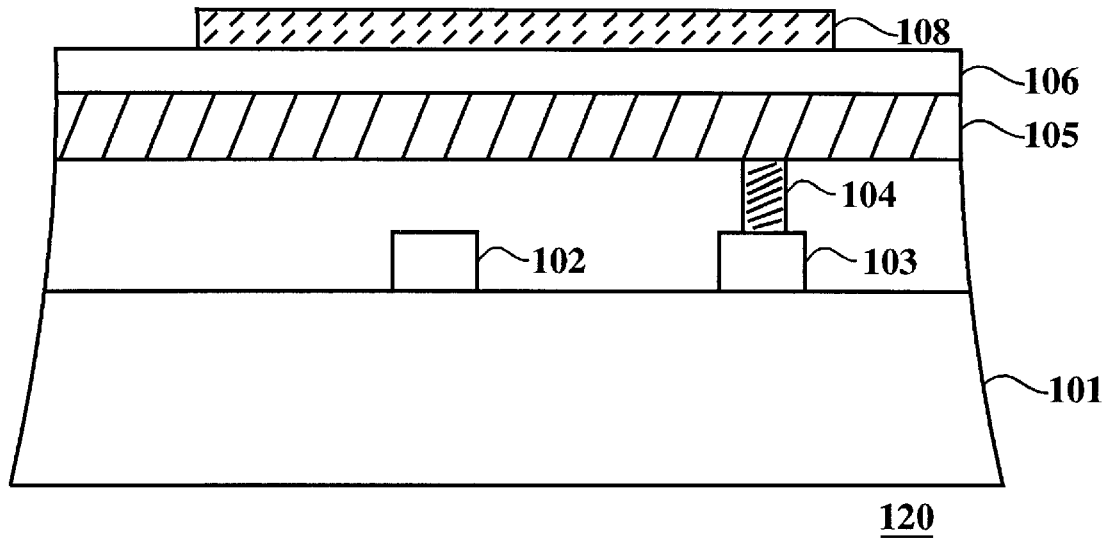
FIG. 1C is a across-sectional view illustrating steps associated with a prior art process for forming an anti-fuse structure.
Figure 1D:
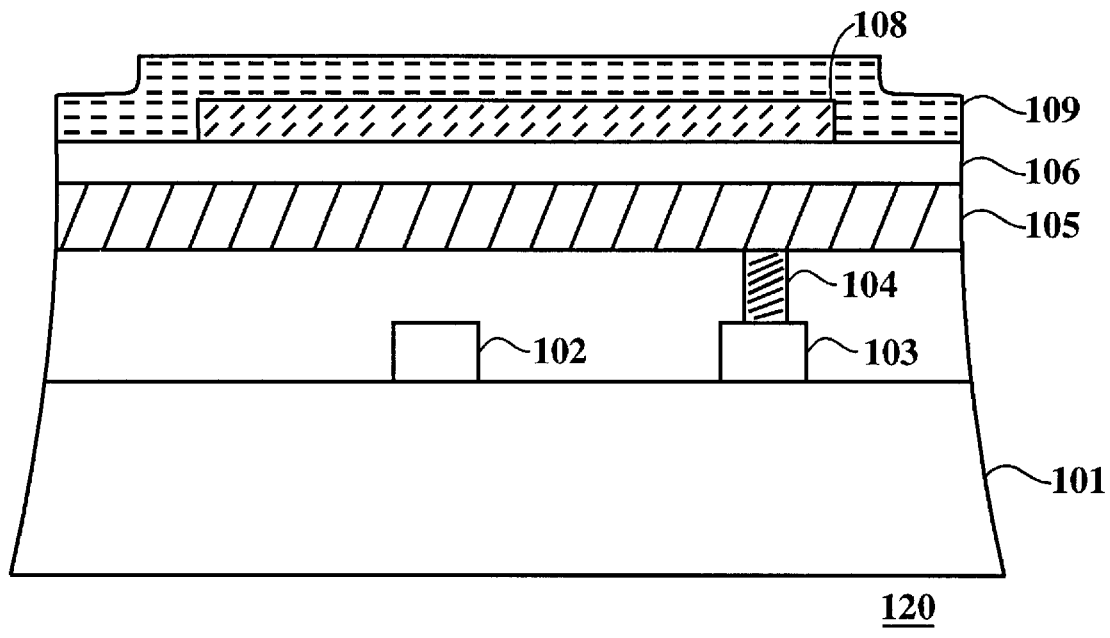
FIG. 1D is a cross-sectional view illustrating steps associated with a prior art process for forming an anti-fuse structure.
Figure 1E:
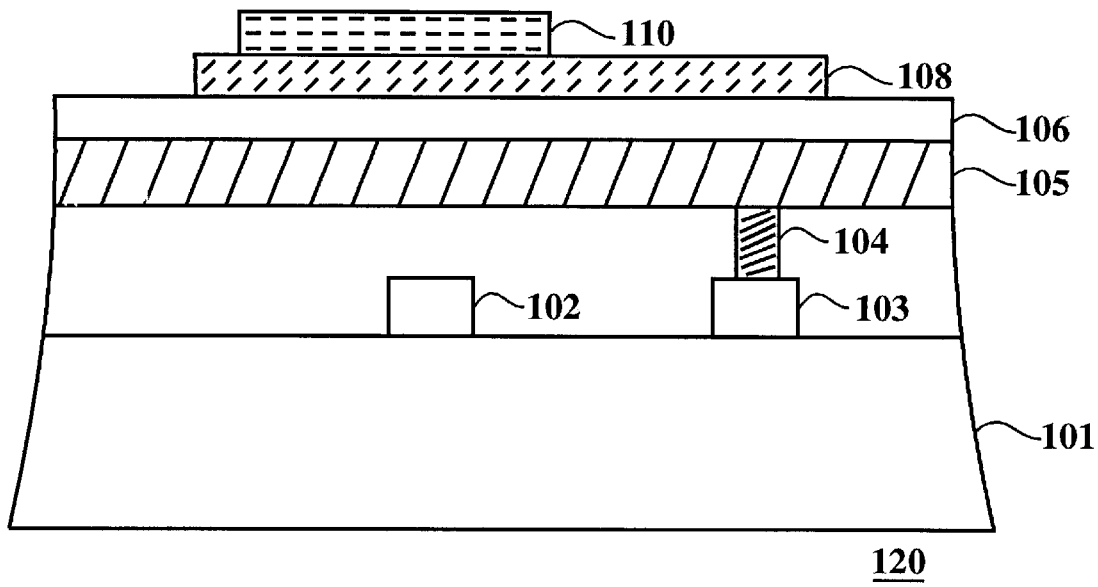
FIG. 1E is a cross-sectional view illustrating steps associated with a prior art process for forming an anti-fuse structure.
Figure 1F:
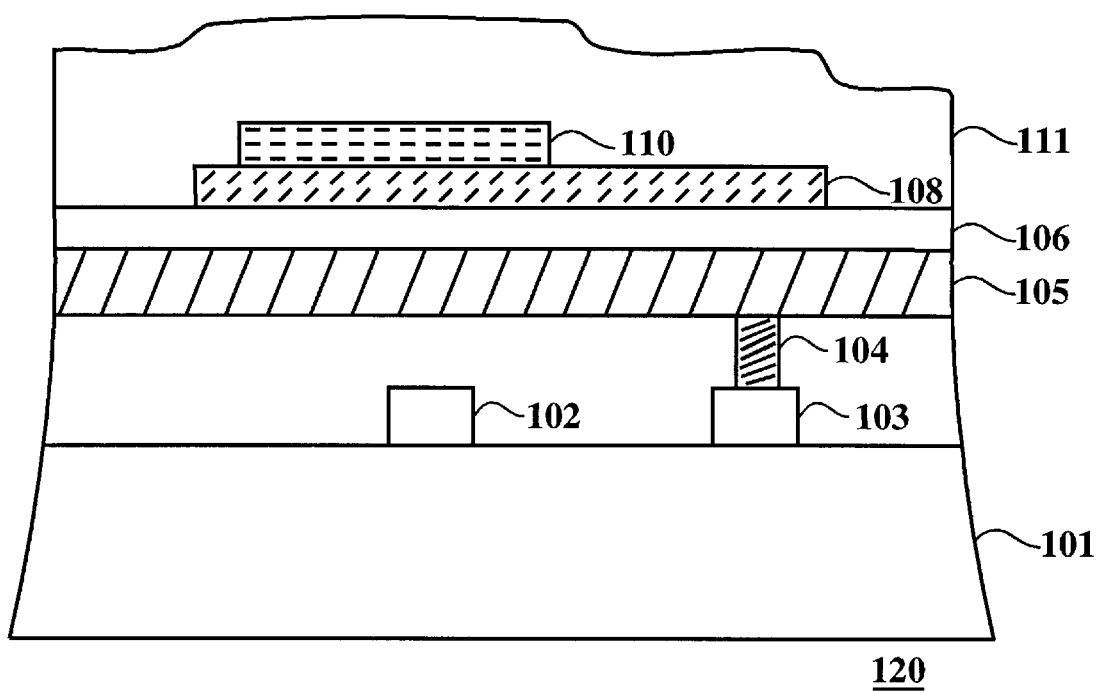
FIG. 1F is a cross-sectional view illustrating steps associated with a prior art process for forming an anti-fuse structure.
Figure 1G:
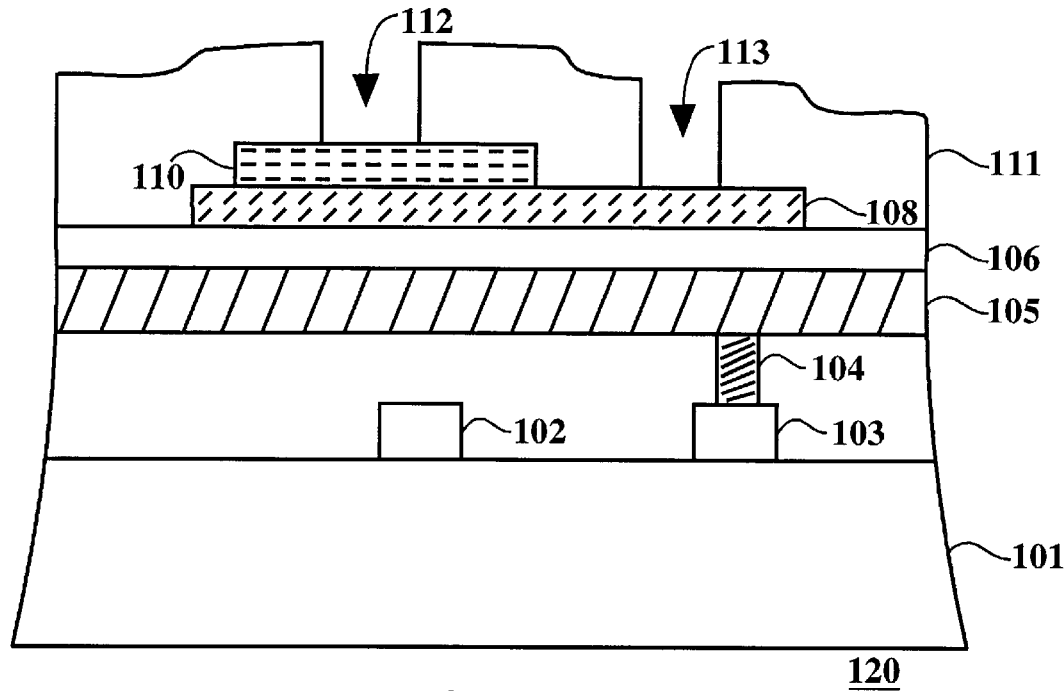
FIG. 1G is a cross-sectional view illustrating steps associated with a prior art process for forming an anti-fuse structure.
Figure 1H:
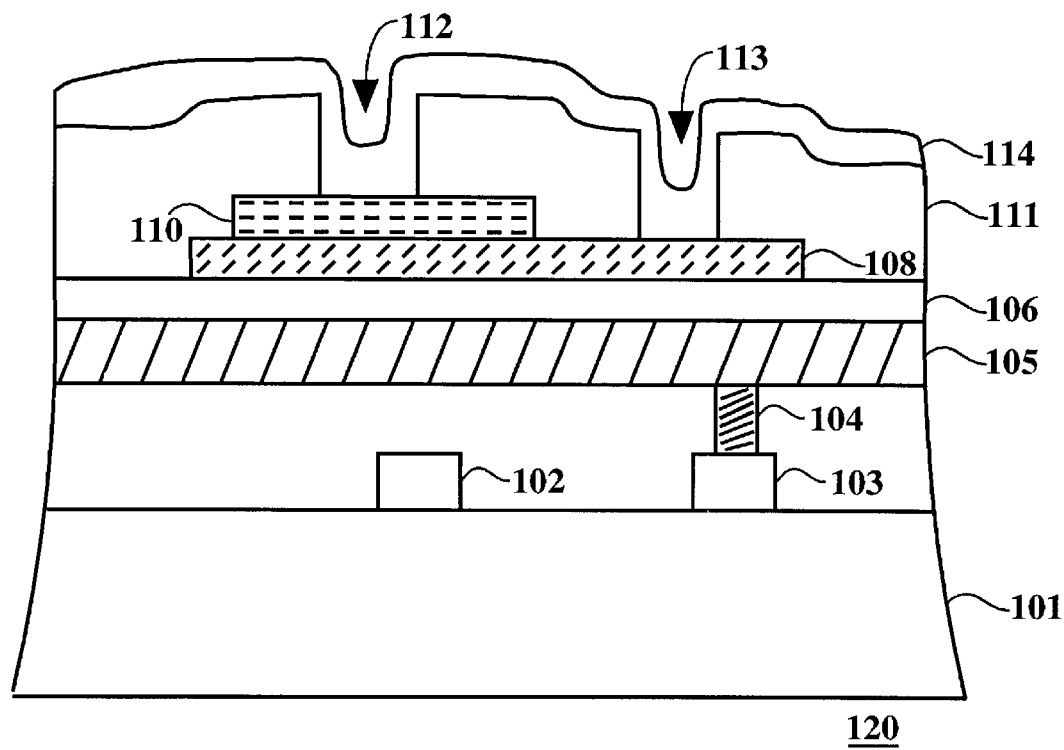
FIG. 1H is a cross-sectional view illustrating steps associated with a prior art process for forming an anti-fuse structure.
Figure 1I:
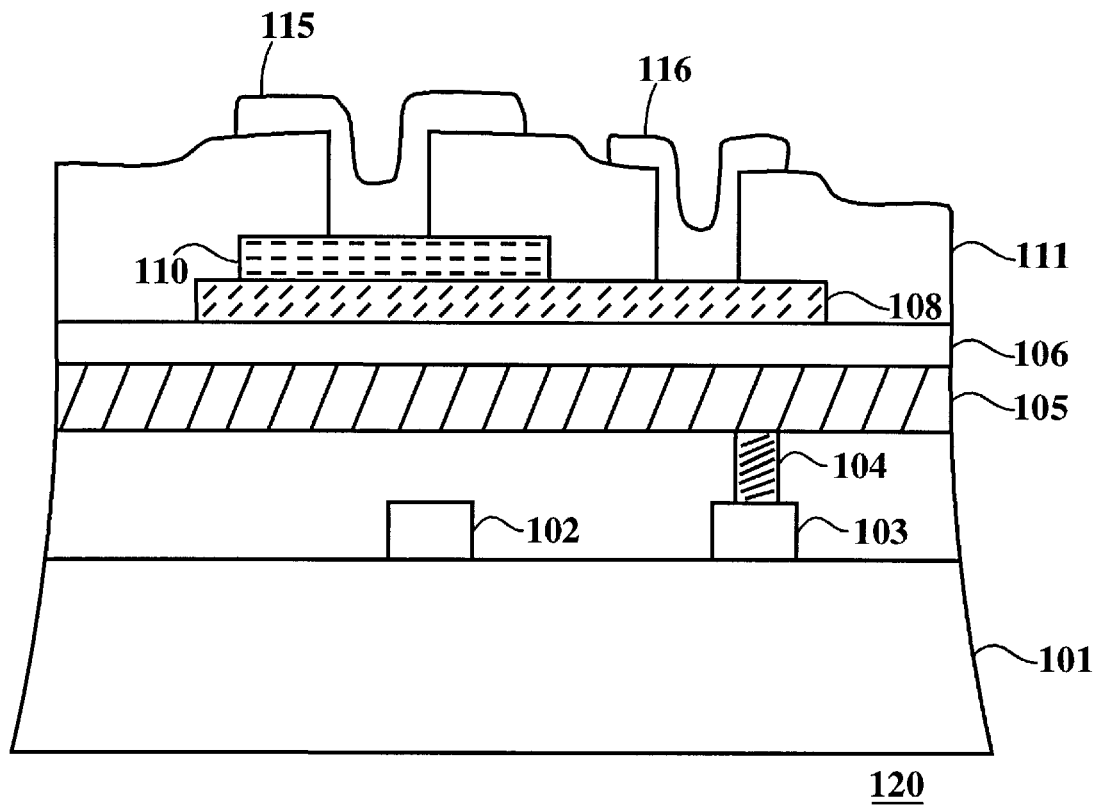
FIG. 1I is a cross-sectional view illustrating steps associated with a prior art process for forming an anti-fuse structure.
Figure 2:
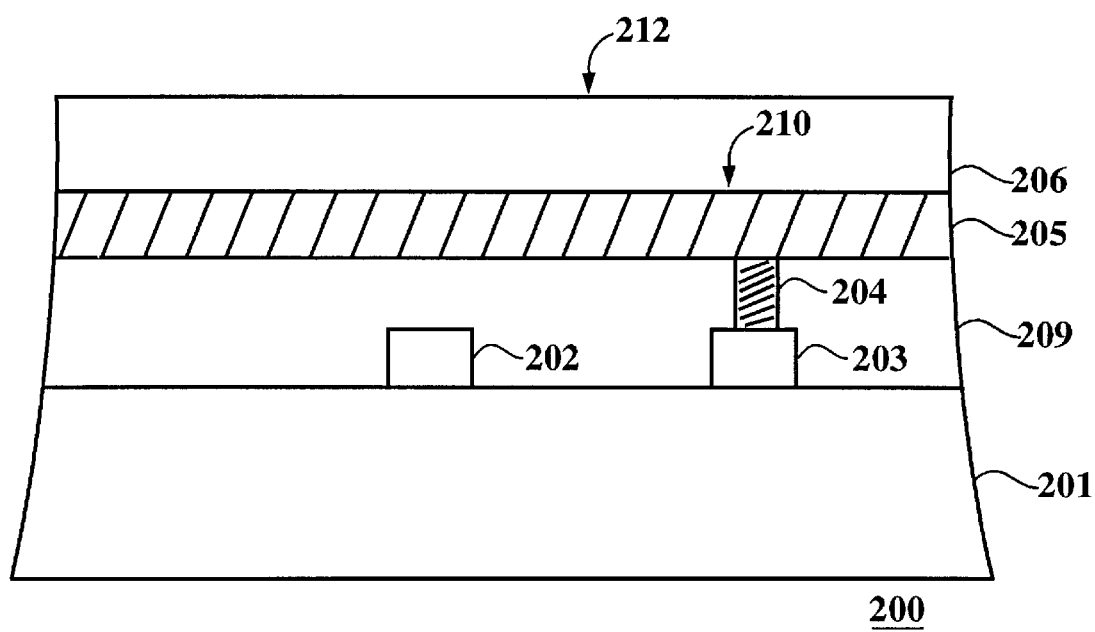
FIG. 2 is a cross-sectional view illustrating a step associated with the formation of a semiconductor device having an anti-fuse structure in accordance with the present claimed invention.

FIGS. 2–9 illustrates the steps for forming a semiconductor device with an anti-fuse structure in accordance with the present invention. First, a first layer of dielectric is deposited over the semiconductor substrate. In one embodiment of the present invention, the first dielectric layer is an oxide. The oxide may be, for example, SiO$_2$ deposited using Plasma Enhanced Chemical Vapor Deposition (PECVD) methods. FIG. 2 shows dielectric layer 206 to be deposited over metal layer 205 of semiconductor device 200. Semiconductor device 200 includes substrate 201 which has semiconductor devices formed thereon which include gates 202–203. Semiconductor device 200 also includes dielectric layer 209, plug 204, and metal layer 205. Dielectric layer 209 is disposed between substrate 201 and metal layer 205. Dielectric layer 209 overlies gates 202–203. Contact 204 electrically connects gate 203 to metal layer 205. Top surface 210 of metal layer 205 is relatively planar as is top surface 212 of dielectric layer 206.

Figure 3:
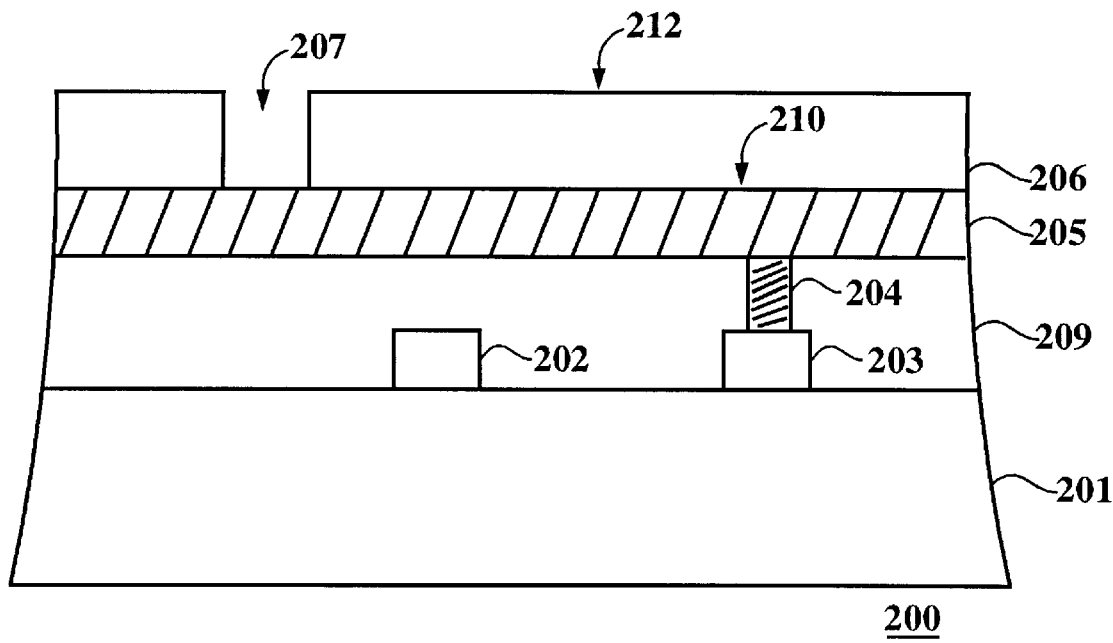
FIG. 3 is a cross-sectional view illustrating a step associated with the formation of a semiconductor device having an anti-fuse structure in accordance with the present claimed invention.

An opening is formed in dielectric layer 206 of FIG. 2 by mask and etch steps. The mask steps include the deposition of a masking layer and the exposure of the mask using photolithographic processes. An etch is then performed so as to selectively etch the dielectric layer. The mask is then removed. Any of a number of different etch chemistries could be used to perform the selective etch. For example, when using an oxide such silicon dioxide as dielectric layer 206, a standard oxide etch may be used. FIG. 3 shows the structure of FIG. 2 after mask and etch steps have formed opening 207. Opening 207 is shown to extend through dielectric layer 206 so as to expose top surface 210 of metal layer 205.

Figure 4:
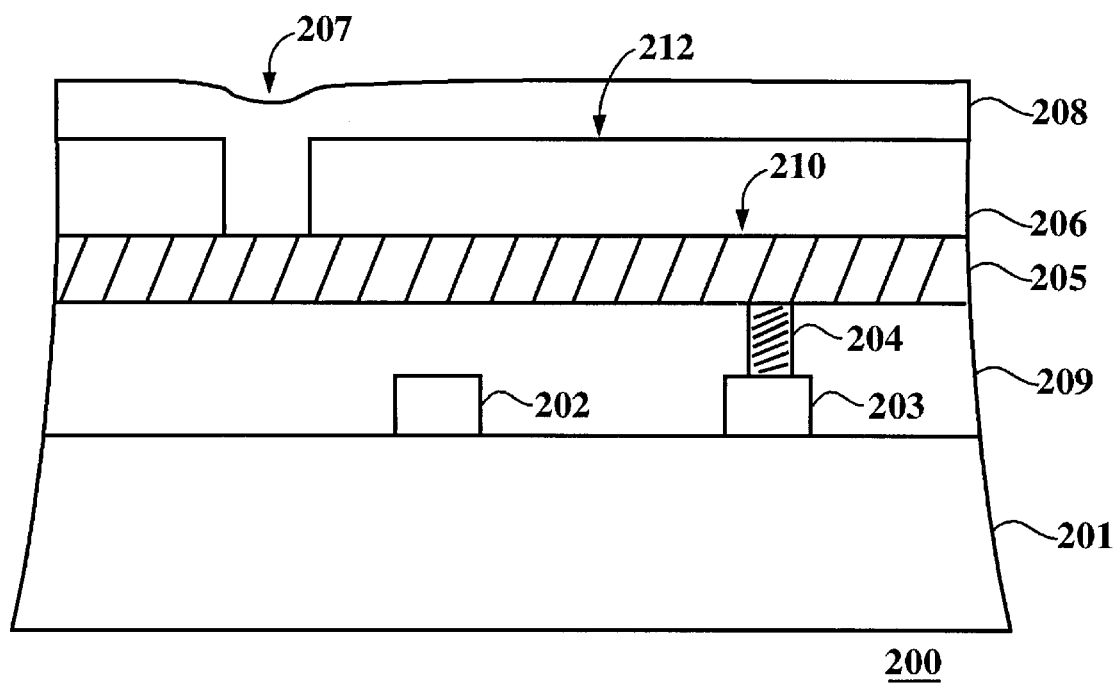
FIG. 4 is a cross-sectional view illustrating a step associated with the formation of a semiconductor device having an anti-fuse structure in accordance with the present claimed invention.

A layer of metal having a low melting point is then deposited over the surface of the semiconductor substrate. FIG. 4 shows the structure of FIG. 3 after metal layer 208 has been deposited over semiconductor device 200. In one embodiment of the present invention, a metal including titanium and tungsten is used to form metal layer 208. Metal layer 208 fills opening 207 such that it overlies a portion of metal layer 205.

Figure 5:
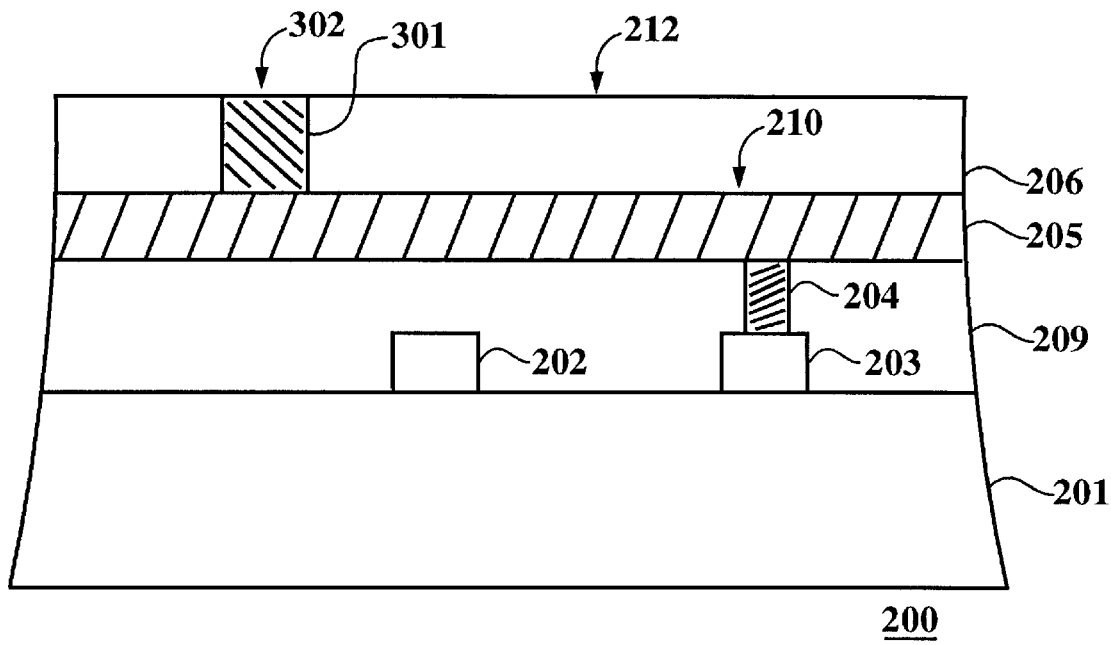
FIG. 5 is a cross-sectional view illustrating a step associated with the formation of a semiconductor device having an anti-fuse structure in accordance with the present claimed invention.

A polishing step is then performed so as to remove the metal which overlies top surface 212 of dielectric layer 206 as shown in FIG. 4. In one embodiment the polishing step is accomplished using a chemical mechanical polishing process (CMP). The CMP step is performed using polish chemicals which etch the surface being polished during the polishing process. The use of a CMP process allows for faster and more uniform polishing. FIG. 5 Shows semiconductor device 200 after a polishing step has removed that portion of metal layer 208 which overlies dielectric layer 206 so as to form plug 301. Contact 301 includes a top surface 302 which is planar as a result of the polishing step. Since the titanium tungsten used to form plug 301 is conductive, plug 301 is connected to metal layer 205 such that electricity may be conducted between metal layer 205 and plug 301.

Figure 6:
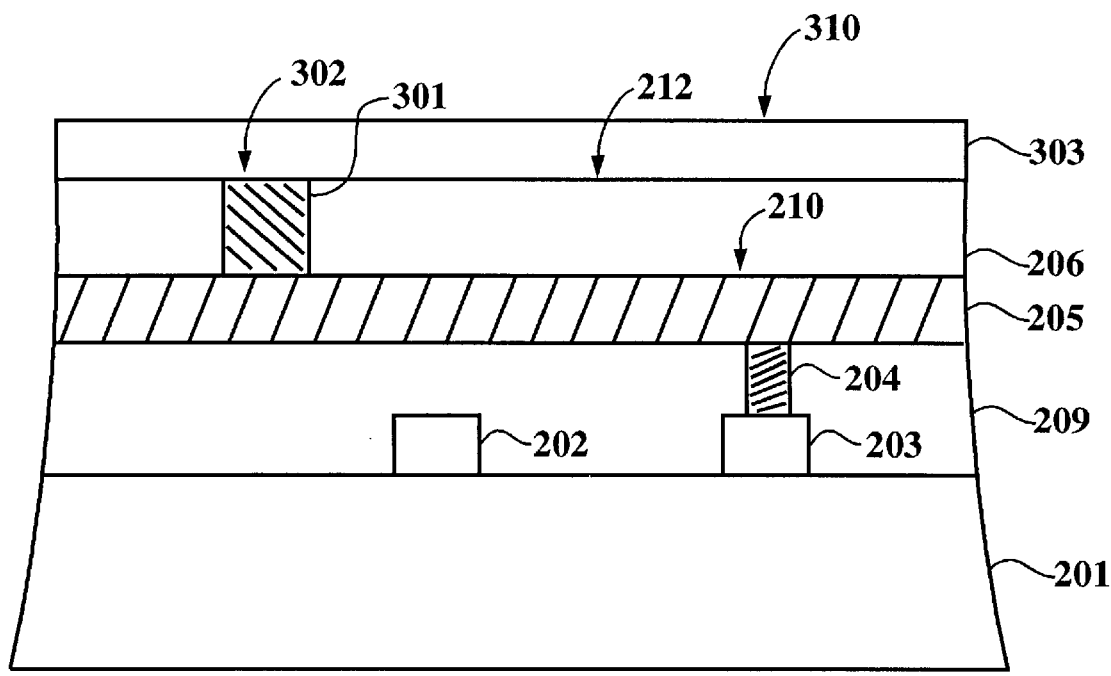
FIG. 6 is a cross-sectional view illustrating a step associated with the formation of a semiconductor device having an anti-fuse structure in accordance with the present claimed invention.

A layer of amorphous silicon is deposited over the semiconductor substrate. The threshold voltage of the anti-fuse may be varied by altering the thickness of the layer of amorphous silicon. For an anti-fuse having a threshold voltage of 10 volts, a thickness of 1,000 angstroms may be used. Typical thicknesses for a layer of amorphous silicon range from 200 angstroms to 1800 angstroms, depending on the desired threshold voltage. FIG. 6 shows the structure of FIG. 5 after layer of amorphous silicon 303 is deposited thereover. Layer of amorphous silicon 303 includes top surface 310. Layer of amorphous silicon 303 overlies top surface 212 of dielectric layer 206 and overlies top surface 302 of plug 301.

Figure 7:
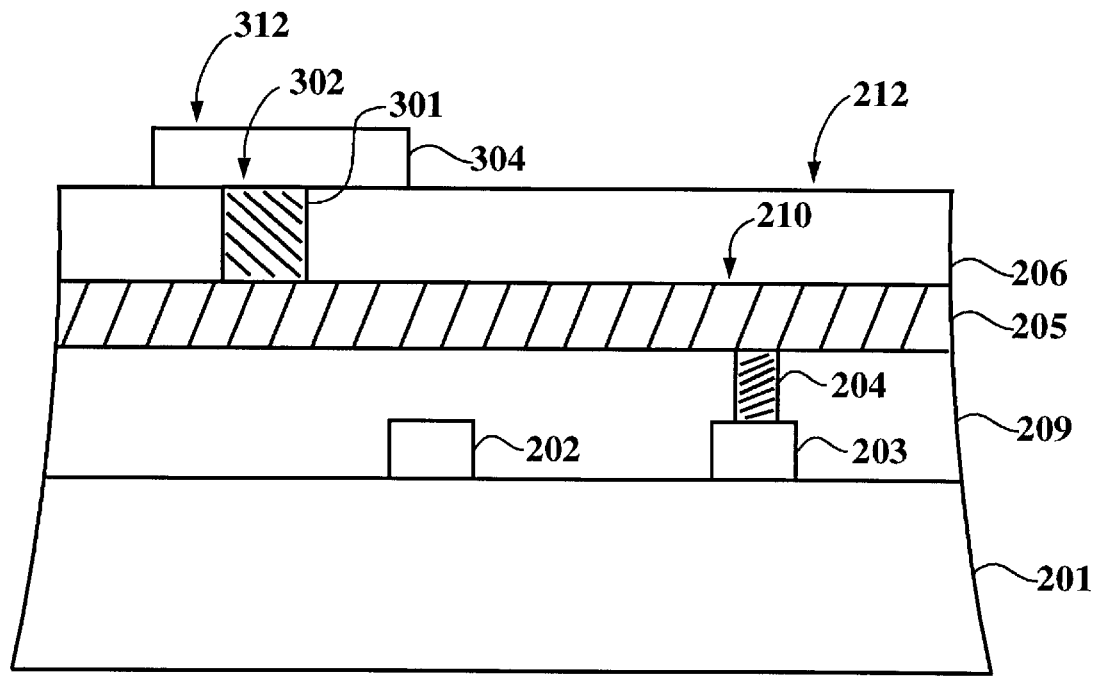
FIG. 7 is a cross-sectional view illustrating a step associated with the formation of a semiconductor device having an anti-fuse structure in accordance with the present claimed invention.

Mask and etch steps are performed so as to etch portions of the amorphous silicon layer so as to form an amorphous silicon block. The mask steps include the deposition of a masking layer and the exposure of the masking layer using photolithographic processes. An etch is then performed so as to selectively etch the amorphous silicon. The mask is then removed. FIG. 7 shows the structure of FIG. 6 after mask and etch steps have etched amorphous silicon layer 303 of FIG. 6 so as to form amorphous silicon block 304 which includes top surface 312. Amorphous silicon block 304 overlies plug 301 and overlies portions of top surface 212 of dielectric layer 206.

Figure 8:
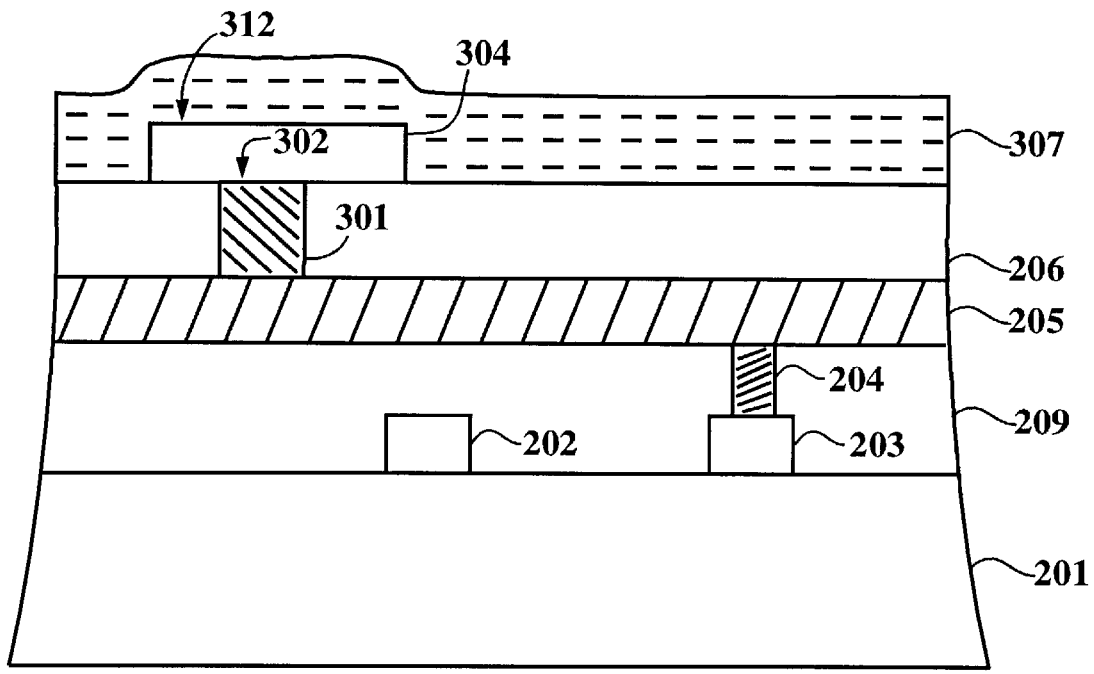
FIG. 8 is a cross-sectional view illustrating a step associated with the formation of a semiconductor device having an anti-fuse structure in accordance with the present claimed invention.

A layer of metal is then deposited over the semiconductor substrate. In the present embodiment, this conductive material is aluminum. In one embodiment, the aluminum layer is deposited using sputtering deposition methods. Aluminum is typically used since it is inexpensive and since it is easy to deposit and easy to etch. FIG. 8 shows the structure of FIG. 7 after the deposition of metal layer 307. Metal layer 307 overlies top surface 312 of amorphous silicon block 304 and overlies those portions of top surface 212 of dielectric layer 206 which are not covered by amorphous silicon block 304.

Figure 9:
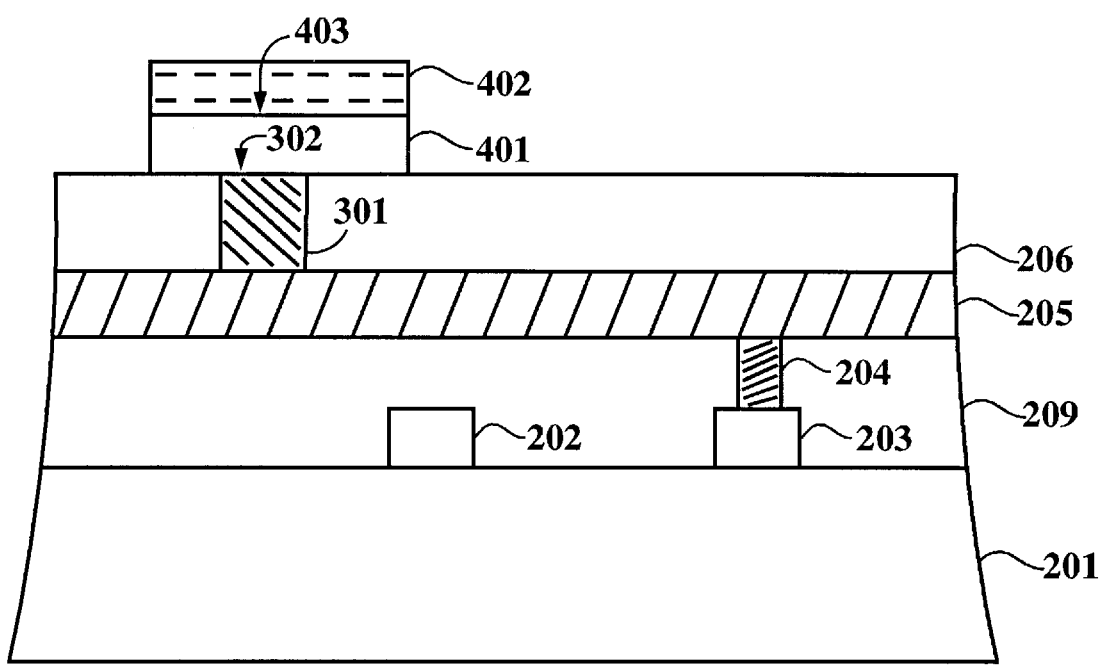
FIG. 9 is a cross-sectional view illustrating a step associated with the formation of a semiconductor device having an anti-fuse structure in accordance with the present claimed invention.

A mask which is patterned so as to define the interconnect structure is formed over the substrate and a selective etch is then performed. In one embodiment an etch chemistry which selectively etches the aluminum layer and the amorphous silicon layer but which does not etch the oxide layer is used. Alternatively, a timed etch may be used. FIG. 9 shows the structure of FIG. 8 after mask and etch steps have been performed so as to define interconnect 402. In addition to etching metal layer 307 of FIG. 8, portions of amorphous silicon block 304 are also etched, forming amorphous silicon block 401. Amorphous silicon block 401 is slightly smaller than amorphous silicon block 304 shown in FIG. 8. Interconnect 402 includes bottom surface 403.

With reference again to FIG. 9, the resulting anti-fuse structure includes interconnect 402 which overlies amorphous silicon block 401. Amorphous silicon block 401 overlies plug 301 which is electrically connected to metal layer 205. Though metal layer 205 and plug 301 and interconnect 402 are made of electrically conductive material, electrical current cannot flow between metal layer 205 and interconnect 402 since amorphous silicon block 401 forms a barrier to current flow.

The anti-fuse is engaged by applying current and voltage equal to or greater than the threshold voltage through metal layer 205 which transmits the current through plug 301 of FIG. 9. Upon the application of voltage and current meeting the threshold of the anti-fuse, electrons migrate through amorphous silicon block 401, heating amorphous silicon block 401 and heating plug 301 so as to cause migration of the metal of plug 301. This migration forms electrical contact between plug 301 and interconnect 402 so as to provide an electrical connection between metal layer 205 and interconnect 402.

The anti-fuse structure of the present invention may be formed using any of a number of other dielectric materials and other metals. In an alternate embodiment of the present invention, spin on glass (SOG) may be used to form dielectric layer 206 of FIGS. 2–9. In yet another embodiment of the present invention, tetraethylorthosilicate (TEOS) may be used to form dielectric layer 206 of FIGS. 2–9. In yet another embodiment of the present invention, copper is used to form interconnect 402 of FIG. 9 and metal layer 205 of FIGS. 2–9.

Though the anti-fuse structure of the present invention and the method of forming an anti-fuse structure of the present invention is illustrated with respect to the formation of an anti-fuse over a first metal layer of a semiconductor device, the anti-fuse structure of the present invention and the method of forming an anti-fuse structure of the present invention are well suited for forming anti-fuses between other metal layers. In addition, the anti-fuse structure of the present invention and the method of forming an anti-fuse structure of the present invention are well suited to forming anti-fuses between conductive elements, whether or not the conductive elements are metal.

The anti-fuse structure and the method of fabrication of an anti-fuse of the present invention takes full advantage of standard semiconductor fabrication steps. The step of depositing dielectric over the first metal layer is performed in typical semiconductor fabrication processes to electrically separate and insulate the structure of the first metal layer from subsequent metal layers. The step of masking and etching the dielectric layer is performed in typical semiconductor fabrication processes in order to expose portions of the first metal layer. The step of depositing a metal layer is performed in typical semiconductor fabrication processes in order to form contacts so as to allow for the selective contact between the first metal layer and subsequent metal layers.

A polishing step is performed in typical semiconductor fabrication processes in order to remove the metal which overlies the dielectric layer. In a typical semiconductor manufacturing process, a metal layer is deposited over the dielectric layer and the metal layer is masked and etched to form interconnects which selectively connect to the underlying metal layer through the plugs. Thus, the step of depositing dielectric, masking and etching the dielectric, depositing a metal layer and etching the metal layer to form plugs and the steps of depositing a second metal layer and masking and etching the second metal layer are generally performed on the semiconductor substrate to form other structures. These other structures may or may not be electrically connected to the anti-fuse structure of the present invention, depending on the design and intended use for the semiconductor device.

In the present invention, only two fabrication steps are required in addition to standard semiconductor process fabrication steps. Other than standard semiconductor process fabrication steps, only the steps of depositing the amorphous silicon layer and the steps of masking and etching the amorphous silicon layer are required to form the anti-fuse of the present invention.

The present invention eliminates the prior art process steps of depositing a metal layer and etching the metal layer to form a strap. These steps take up valuable manufacturing processing time and decrease throughput. Thus, by eliminating these steps, the present invention increases throughput and decreases manufacturing cost. Moreover, the present invention gives increased yield since the additional steps required by prior art anti-fuse structures and fabrication processes (which may cause defects in the semiconductor device) are eliminated.

The foregoing descriptions of specific embodiments of the present invention have been presented for purposes of illustration and description. They are not intended to be exhaustive or to limit the invention to the precise forms disclosed, and obviously many modifications and variations are possible in light of the above teaching. The embodiments were chosen and described in order to best explain the principles of the invention and its practical application, to thereby enable others skilled in the art to best utilize the invention and various embodiments with various modifications as are suited to the particular use contemplated. It is intended that the scope of the invention be defined by the Claims appended hereto and their equivalents.

We claim:

1. A strapless anti-fuse structure formed over a semiconductor substrate having semiconductor devices formed therein, said strapless anti-fuse structure comprising:

a metal layer formed over said semiconductor substrate, said metal layer electrically coupled to said semiconductor devices;

a dielectric layer deposited over said metal layer such that said dielectric layer overlies said metal layer;

an unetched plug disposed within an opening in said dielectric layer, said unetched plug electrically coupled to said metal layer;

an amorphous silicon block disposed over said unetched plug such that said amorphous silicon block is electrically connected to said unetched plug, said amorphous silicon block having a height, said height defining a threshold voltage for the engagement of said strapless antifuse structure; and an interconnect disposed over said amorphous silicon block such that said interconnect is electrically connected to said amorphous silicon block such that, upon the application of current and a voltage greater than the threshold voltage of said strapless antifuse structure to said first metal layer, said metal in said unetched plug migrates so as to generate an electrical contact between said metal layer and said interconnect, said strapless anti-fuse structure not having an etched metal strap portion.

2. The strapless anti-fuse structure of claim 1 wherein said dielectric layer is comprised of oxide.

3. The strapless anti-fuse structure of claim 1 wherein said dielectric layer is comprised of tetraethylorthosilicate.

4. The strapless anti-fuse structure of claim 1 wherein said dielectric layer is comprised of spun on glass.

5. The strapless anti-fuse structure of claim 1 wherein said unetched plug is comprised of a metal having a low melting point.

6. The strapless anti-fuse structure of claim 1 wherein said unetched plug is comprised of titanium.

7. The strapless anti-fuse structure of claim 6 wherein said unetched plug is comprised of tungsten.

8. The strapless anti-fuse structure of claim 1 wherein said dielectric layer is comprised of silicon dioxide.

9. The strapless anti-fuse structure of claim 7 wherein said metal layer is comprised of aluminum.

10. The strapless anti-fuse structure of claim 9 wherein said interconnect is comprised of aluminum.

11. The strapless anti-fuse structure of claim 1 wherein said unetched plug directly overlies said metal layer, said amorphous silicon block directly overlies said unetched plug and directly overlies portions of said dielectric layer, and said interconnect directly overlies said amorphous silicon block such that said amorphous silicon block is disposed directly between said interconnect and said unetched plug.

* * * * *

UNITED STATES PATENT AND TRADEMARK OFFICE
CERTIFICATE OF CORRECTION

PATENT NO : 6,016,001

DATED : June 18, 2000

INVENTOR(S): Ivan Sanchez, Danny Echtle and Landon B. Vines

It is certified that error appears in the above-identified patent and that said Letters Patent is hereby corrected as shown below:

On the title page, item [22], filing date should read--

June 18, 1997--.

Signed and Sealed this

Twenty-seventh Day of March, 2001

Attest:

NICHOLAS P. GODICI

Attesting Officer

Acting Director of the United States Patent and Trademark Office